United States Patent
Huang et al.

(10) Patent No.: US 10,243,147 B2
(45) Date of Patent: Mar. 26, 2019

(54) ORGANIC LIGHT-EMITTING ELEMENT

(71) Applicant: E-RAY OPTOELECTRONICS TECHNOLOGY CO., LTD., Taoyuan (TW)

(72) Inventors: Heh-Lung Huang, Taoyuan (TW); Banumathy Balaganesan, Taoyuan (TW); Hsuan-Lung Lu, Taoyuan (TW)

(73) Assignee: E-RAY OPTOELECTRONICS TECHNOLOGY CO., LTD., Taoyuan (TW)

( * ) Notice: Subject to any disclaimer, the term of this patent is extended or adjusted under 35 U.S.C. 154(b) by 173 days.

(21) Appl. No.: 15/178,737

(22) Filed: Jun. 10, 2016

(65) Prior Publication Data
US 2017/0025617 A1 Jan. 26, 2017

(30) Foreign Application Priority Data
Jul. 21, 2015 (TW) ............... 104123518 A

(51) Int. Cl.
| C09K 11/06 | (2006.01) |
| H01L 51/00 | (2006.01) |
| H01L 51/50 | (2006.01) |
| H01L 51/52 | (2006.01) |

(52) U.S. Cl.
CPC .......... *H01L 51/0059* (2013.01); *C09K 11/06* (2013.01); *H01L 51/0061* (2013.01); *H01L 51/0085* (2013.01); *H01L 51/5064* (2013.01); *H01L 51/5206* (2013.01); *H01L 51/5221* (2013.01); *C09K 2211/1007* (2013.01); *C09K 2211/1014* (2013.01); *H01L 51/006* (2013.01); *H01L 51/0058* (2013.01); *H01L 51/0072* (2013.01); *H01L 51/5012* (2013.01); *H01L 51/5016* (2013.01); *H01L 2251/301* (2013.01); *H01L 2251/308* (2013.01)

(58) Field of Classification Search
CPC ............. H01L 51/0059; H01L 51/0072; H01L 51/5064
See application file for complete search history.

(56) References Cited

U.S. PATENT DOCUMENTS

| 5,837,166 A * | 11/1998 | Kawamura | C07C 211/54 252/301.16 |
| 2003/0205696 A1* | 11/2003 | Thoms et al. | C09K 11/06 252/301.16 |
| 2004/0113547 A1* | 6/2004 | Son | C09K 11/06 313/504 |
| 2012/0104940 A1* | 5/2012 | Shin | C09K 11/06 313/504 |
| 2013/0187137 A1* | 7/2013 | Mizuki | C07C 211/54 257/40 |
| 2017/0200771 A1* | 7/2017 | Sung | H01L 27/3213 |

FOREIGN PATENT DOCUMENTS

| JP | 2013-021282 | 1/2013 |
| JP | 2013-046067 | 3/2013 |
| JP | 2014-131985 | 7/2014 |
| WO | 2013/038944 | 3/2013 |
| WO | 2014/042197 | 3/2014 |

OTHER PUBLICATIONS

Japanese Office Action for Japanese Patent Application No. 2016-135776 dated Jun. 19, 2017.

* cited by examiner

*Primary Examiner* — Melissa A Rioja
(74) *Attorney, Agent, or Firm* — Amin, Turocy & Watson LLP

(57) ABSTRACT

An organic light-emitting element is provided, including: an anode; a first hole assisting layer and a second hole assisting layer sequentially formed on the anode; a light-emitting layer formed on and in contact with the second hole assisting layer, the light-emitting layer including a host luminesce containing a compound having a carbazole group; at least one electron transport layer formed on the light-emitting layer; and a cathode formed on the electron transport layer, the second hole assisting layer including a hole transport compound represented by formula (I) to improve the performance of the organic light-emitting element.

16 Claims, 4 Drawing Sheets

ORGANIC LIGHT-EMITTING ELEMENT

TECHNICAL FIELD

The present disclosure relates to organic light-emitting elements, especially to an organic light-emitting element capable of improving properties of an element.

BACKGROUND

Recently, organic light-emitting elements (organic light-emitting devices, OLED in short) have attracted attention due to their properties such as high luminance, high refresh rate, wide color gamut, etc., since these properties allow the OLED to be more suitable for application in portable electronic devices.

In general, an organic light-emitting element comprises an anode, a hole transport layer, a light-emitting layer, an electron transport layer and a cathode sequentially deposited by vacuum deposition or coating methods. When a voltage is applied on the organic light-emitting element, holes and electrons are implanted by the anode and the cathode respectively into the organic layer(s). The implanted holes enter the light-emitting layer through the hole transport layer, and the electrons migrate into the light-emitting layer through the electron transport layer. In the light-emitting layer, electrons combine with holes to generate excitons. The excitons relax via a light-emitting mechanism to emit light.

The reason for manufacturing an organic light-emitting element using a multilayer thin film structure encompasses the stability of the interfaces between the electrodes and organic layers. Additionally, there is a significant difference between the migration rates of electrons and holes in an organic material. Accordingly, if a hole transport layer and an electron transport layer are suitably selected, the holes and electrons can be transported into the light-emitting layer efficiently to improve the luminescent efficiency of the element.

However, in actual manufacturing process of a display, it is difficult to obtain an organic material meeting all aforementioned requirements. For example, it is problematic in maintaining the property of an organic light-emitting element in emitting blue light while still prolong the life of the element. Therefore, it is urgent to develop an organic light-emitting element with longer life and high performance.

SUMMARY

The present disclosure provides an organic light-emitting element, which includes: an anode; a first hole assisting layer and a second hole assisting layer sequentially formed on the anode, wherein the second hole assisting layer contains a hole transport compound represented by formula (I),

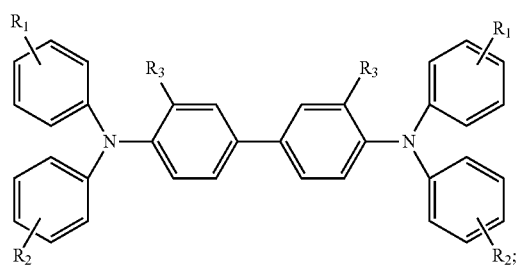

a light-emitting layer formed on and in contact with the second hole assisting layer, the light-emitting layer comprising a host luminescent material containing a compound having a carbazole group; at least one electron transport layer formed on the light-emitting layer; and a cathode formed on the electron transport layer, wherein $R_1$ and $R_2$ can be the same or different from each other, each of $R_1$ and $R_2$ represents hydrogen, unsubstituted phenyl, or phenyl substituted with C1-C4 alkyl, and $R_3$ represents hydrogen, C1-C4 alkyl, C1-C4 alkoxy or chlorine.

The present disclosure also provides an organic light-emitting element, which includes: an anode, a first hole assisting layer, a second hole assisting layer and a third hole assisting layer sequentially formed on the anode, wherein the second hole assisting layer contains a hole transport compound represented by formula (I),

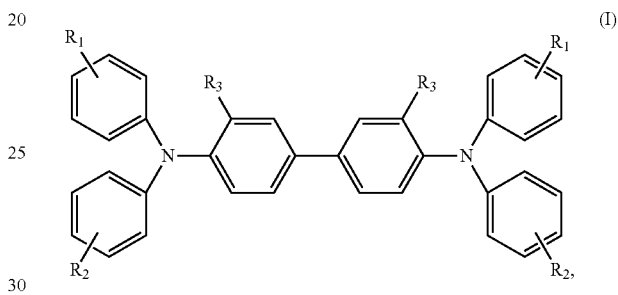

the third hole assisting layer contains a compound represented by formula (IV),

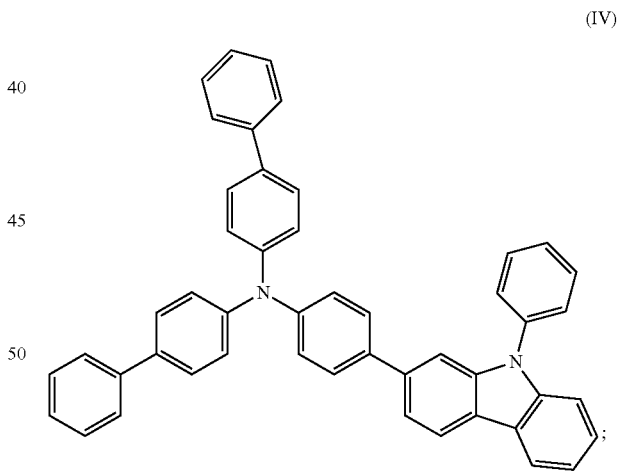

a light-emitting layer formed on the third hole assisting layer, the light-emitting layer comprising a host luminescent material containing a compound having a carbazole group; at least one electron transport layer formed on the light-emitting layer; and a cathode formed on the electron transport layer, wherein $R_1$ and $R_2$ can be the same or different from each other, and each of $R_1$ and $R_2$ represents hydrogen, unsubstituted phenyl, or phenyl substituted with C1-C4 alkyl, and $R_3$ represents hydrogen, C1-C4 alkyl, C1-C4 alkoxy or chlorine.

In one embodiment, the organic light-emitting element is a fluorescent light-emitting element, and the light-emitting layer contains a fluorescent material. In addition, the light-emitting element emitting fluorescence is preferably an organic light-emitting element emitting blue light.

In another embodiment, the organic light-emitting element is a phosphorescent light-emitting element, and the light-emitting layer contains a phosphorescent material. In addition, the phosphorescent light-emitting element is preferably an organic light-emitting element emitting red or green light.

At least two hole assisting layers are arranged in the organic light-emitting element of the present disclosure, and a hole transport compound represented by formula (I) is formed in the second hole assisting layer to improve the performance of the organic light-emitting element, e.g., to overcome the disadvantage of short life-time of the organic light-emitting element emitting blue light, or to reduce drive voltage and to enhance luminescent efficiency of the organic light-emitting element emitting red or green light.

DETAILED DESCRIPTION

Figure 1:
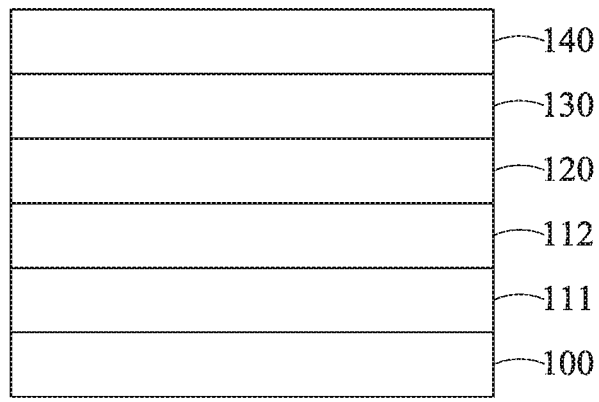
FIG. 1 is a sectional view of the structure of an organic light-emitting element in one embodiment of the present disclosure.

The present disclosure will be illustrated in detail through particular embodiments, and a person skilled in the art can easily understand other advantages and effects of the present disclosure based on the content described in the present specification.

Note, the structures, ratios, sizes, and the like drawn in the FIGS. attached to the present specification all are used for illustrating the content described in the present specification only, so as to be understood and read by a person skilled in the art, but not as the limitations for limiting the practice of the disclosure. Therefore, they have no substantial meaning in view of technique, and any modification on the structures, alternation of ratios or adjustment of sizes without affecting the effects and purposes achievable by the present disclosure should fall into the range encompassed in the technical content described in the disclosure. Meanwhile, terms used herein such as "upper", "first", "second", "third", etc. tend to be convenient for clear statement, but not for limiting the practical range of the present disclosure, so the alternation or adjustment of relative relationship without substantially technical alternation should be considered to be encompassed in the practical range of the present disclosure.

The present disclosure provides an organic light-emitting element, which includes: an anode; a first hole assisting layer and a second hole assisting layer sequentially formed on the anode, wherein the second hole assisting layer contains a hole transport compound of formula (I); a light-emitting layer in contact with and formed on the second hole assisting layer, and that light-emitting layer further contains a host luminescent material containing a compound having a carbazole group; at least one electron transport layer formed on the light-emitting layer; and a cathode formed on the electron transport layer,

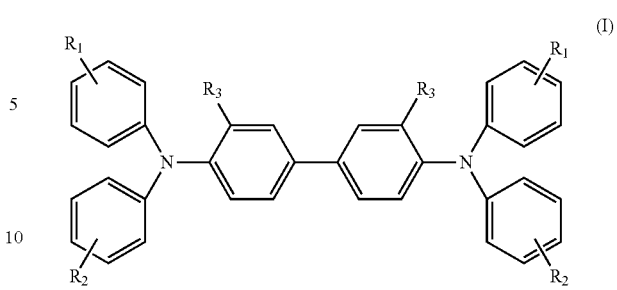

(I)

wherein $R_1$ and $R_2$ can be the same or different from each other, and each of $R_1$ and $R_2$ represents hydrogen, unsubstituted phenyl, or phenyl substituted with C1-C4 alkyl; and $R_3$ represents hydrogen, C1-C4 alkyl, C1-C4 alkoxy or chlorine.

The present disclosure also provides an organic light-emitting element, which includes: an anode, a first hole assisting layer, a second hole assisting layer and a third hole assisting layer sequentially formed on the anode, wherein the second hole assisting layer contains a hole transport compound of formula (I), the third hole assisting layer contains a compound having the structure of formula (IV); a light-emitting layer formed on the third hole assisting layer, and the light-emitting layer further contains a host luminescent material containing a compound having a carbazole group; at least one electron transport layer formed on the light-emitting layer; and a cathode formed on the electron transport layer,

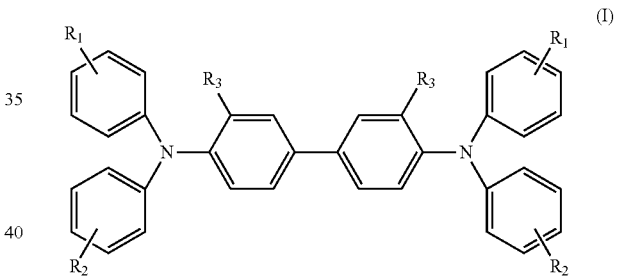

(I)

wherein $R_1$ and $R_2$ can be the same or different from each other, and each of $R_1$ and $R_2$ represents hydrogen, unsubstituted phenyl, or phenyl substituted with C1-C4 alkyl; and $R_3$ represents hydrogen, C1-C4 alkyl, C1-C4 alkoxy or chlorine,

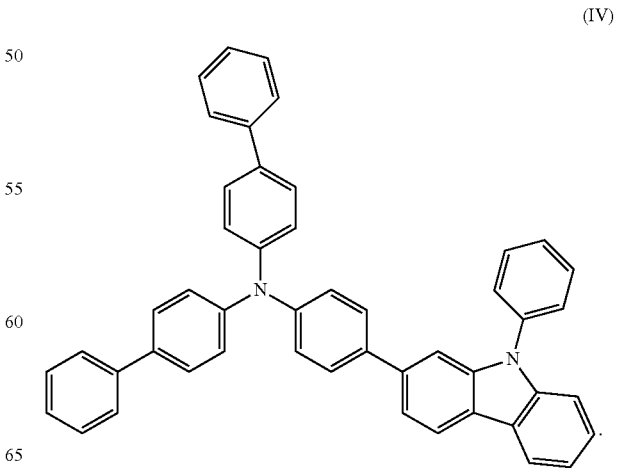

(IV)

U.S. Pat. No. 5,844,363 describes a flexible transparent substrate attached to an anode, which is incorporated herein in its entirety by reference. For example, the anode used in the organic light-emitting element is generally made of indium tin oxide and can be formed on a transparent glass substrate or a flexible transparent substrate, and a cathode relative to the anode, such as the cathode illustrated in U.S. Pat. No. 5,703,436 and U.S. Pat. No. 5,707,745 (which are incorporated herein in their entirety by reference) has a thin metal layer, such as magnesium/silver (Mg:Ag) or aluminum, and the thin metal layer is deposited by sputtering to cover the transparent substrate.

The material used in the hole assisting layers of the present disclosure, such as a hole injection layer, a hole transport layer and a hole block layer, or the electron transport layer can be selected from the commonly used materials. In one embodiment, the first hole assisting layer contains a compound having the structure of formula (II),

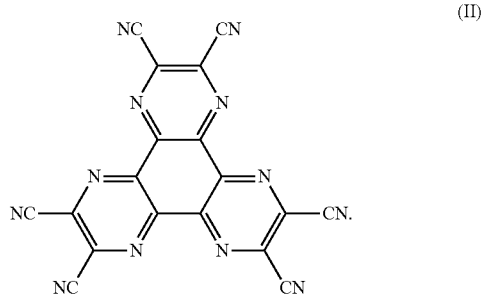 [SMILES: N#Cc1nc2c3nc(C#N)c(C#N)nc3c3nc(C#N)c(C#N)nc3c2nc1C#N]

(II)

Furthermore, the second hole assisting layer contains a hole transport compound of formula (I). In one embodiment, the $R_1$ and $R_{12}$ in formula (I) is phenyl, and R3 is hydrogen. For example, the hole transport compound has the structure of formula (Ia):

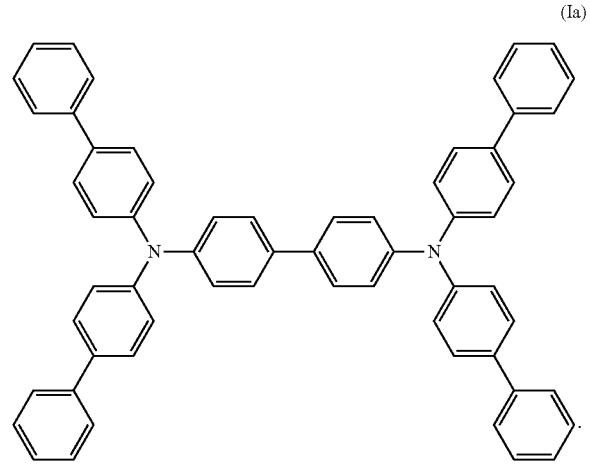 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1]

(Ia)

The main discovery in the present disclosure is that an organic light-emitting element has to comprise at least two hole assisting layers, and the second hole assisting layer contains a hole transport compound of formula (I). Therefore, other materials without special explanation also can be applied in the present disclosure, for example, the polymer material (PLEDs) included in an organic light-emitting element disclosed in U.S. Pat. No. 5,247,190 which is incorporated herein in its entirety by reference.

Unless otherwise specified, any layers in various Examples can be formed by deposition in any suitable methods. For an organic layer, the preferred methods include the thermal evaporation deposition and printing disclosed in U.S. Pat. No. 6,013,982 and U.S. Pat. No. 6,087,196 incorporated herein in their entirety by reference; the organic vapor phase deposition (OVPD) disclosed in U.S. Pat. No. 6,337,102 incorporated herein in its entirety by reference; deposition by organic vapor jet printing (OVJP) disclosed in U.S. Pat. No. 10,233,470 incorporated herein in its entirety by reference. Other suitable methods include spin coating and a process based on solution. The process based on solution is performed preferably under nitrogen or inert atmosphere. For other layers, the preferred methods include thermal evaporation deposition. The preferred patterning methods include the process of depositing through a mask following by cold soldering by combining a jet printing method or organic vapor jet printing method with a patterning method disclosed in U.S. Pat. No. 6,294,398 and U.S. Pat. No. 6,468,819 incorporated herein in their entirety by reference. Certainly, other methods also can be used. Materials for deposition can be tailored to be suitable for the particular deposition method.

In the organic light-emitting element of the present disclosure, at least two hole assisting layers are included, and a hole transport compound of formula (I) is formed on the second hole assisting layer, to improve the performance of the organic light-emitting element. For example, in one embodiment, the organic light-emitting element is a fluorescent light-emitting element, so that the light-emitting layer contains a fluorescent material. In one Example, the fluorescent material is a guest luminescent material, and the light-emitting layer contains a host luminescent material. For example, the guest luminescent material is the compound having the structure of formula (III), and the host luminescent material is a compound having a carbazole group.

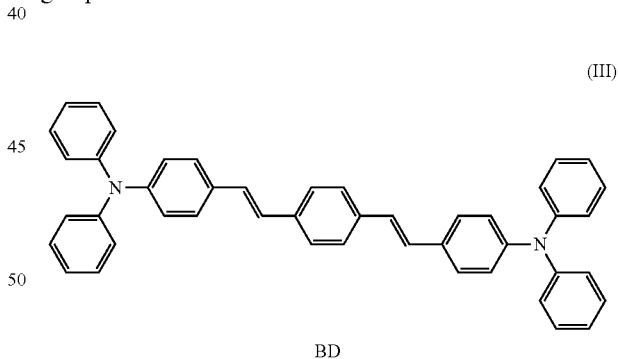

(III)

BD

In one Example of fluorescent organic light-emitting element, the organic light-emitting element further comprises a third hole assisting layer formed between the second hole assisting layer and the light-emitting layer. Additionally, the fluorescent light-emitting element is preferably an organic light-emitting element emitting blue light, which can overcome the problem of short life of existing organic light-emitting element emitting blue light.

In another embodiment, the organic light-emitting element is a phosphorescent light-emitting element, so that the light-emitting layer contains a phosphorescent material. In one Example, the phosphorescent material is a guest luminescent material, and the light-emitting layer contains a host luminescent material. For example, the guest luminescent material is a metal complex of iridium, and the host luminescent material is a compound having a carbazole group.

In one Example of phosphorescent organic light-emitting element, the organic light-emitting element further comprises a third hole assisting layer formed between the second hole assisting layer and the light-emitting layer. Additionally, the phosphorescent light-emitting element is preferably an organic light-emitting element emitting red or green light, which can reduce drive voltage of the element and enhance the luminous efficiency. With respect to an electron transport layer, organic alkali/alkaline metal complexes, oxides, halides, carbonates, and phosphates of alkali/alkaline group metals containing at least one metal selected from lithium and cesium, can be used. The organic metal complexes are known in aforementioned patents or other literatures, and suitable organic metal complexes can be selected to use in the present disclosure. For example, lithium quinolinolate (Liq) can be used as an electronically conductive dopant in the electron transport layer.

As shown in FIG. 1, it is the sectional view of the organic light-emitting element of the present disclosure, the organic light-emitting element includes: an anode 100; a first hole assisting layer 111 and a second hole assisting layer 112 sequentially formed on the anode 100, wherein the second hole assisting layer 112 contains a hole transport compound of formula (I); a light-emitting layer 120 formed on the second hole assisting layer 112; at least one electron transport layer 130 formed on the light-emitting layer 120; and a cathode 140 formed on the electron transport layer 130.

Figure 2:
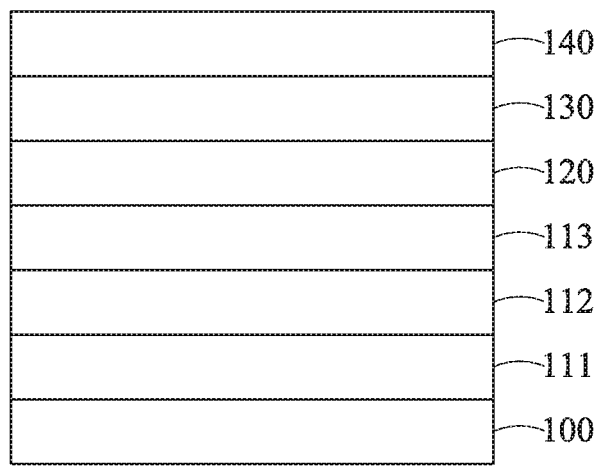
FIG. 2 is a sectional view of the structure of an organic light-emitting element in another embodiment of the present disclosure.

As shown in FIG. 2, it is a sectional view of the organic light-emitting element of the present disclosure having a third hole assisting layer. The difference between the present Example and the organic light-emitting element shown in FIG. 1 is that the third hole assisting layer 113 is formed between the second hole assisting layer 112 and the light-emitting layer 120.

Example 1: Manufacture of Fluorescent Organic Light-Emitting Elements

A substrate is cleaned to degrease using a solvent and ultraviolet together with ozone prior to loading the substrate to an evaporation system. Thereafter, the substrate is sent to a vacuum deposition chamber, and all layers are deposited on the top of the substrate. Each layer is deposited sequentially by a heated evaporation boat at a vacuum degree about $10^{-6}$ Torr:

a) an iridium tin oxide (ITO) layer with a thickness of 1,250 Å;
b) a first hole assisting layer with a thickness of 300 Å, HI;
c) a second hole assisting layer with a thickness of 1,500 Å, a compound of formula (Ia);
d) a third hole assisting layer with a thickness of 100 Å, compound HT2;
e) a light-emitting layer with a thickness of 250 Å, comprising a host luminescent material EPH and a guest luminescent material BD doped therein at 4 weight % (BD and EPH are trade names of products manufactured by e-Ray Optoelectronics Technology Co., Ltd.);
f) an electron transport layer with a thickness of 200 Å, comprising compound ET doped with 50 weight % of lithium quinolinolate (Liq);
g) an electron injection layer with a thickness of 10 Å, lithium fluoride (LiF); and
h) a cathode with a thickness of 1,500 Å, comprising Al.

The structure of the element can be represented as: ITO/HI/(Ia)/HT2/BD:EPH/Liq:ET/LiF/Al.

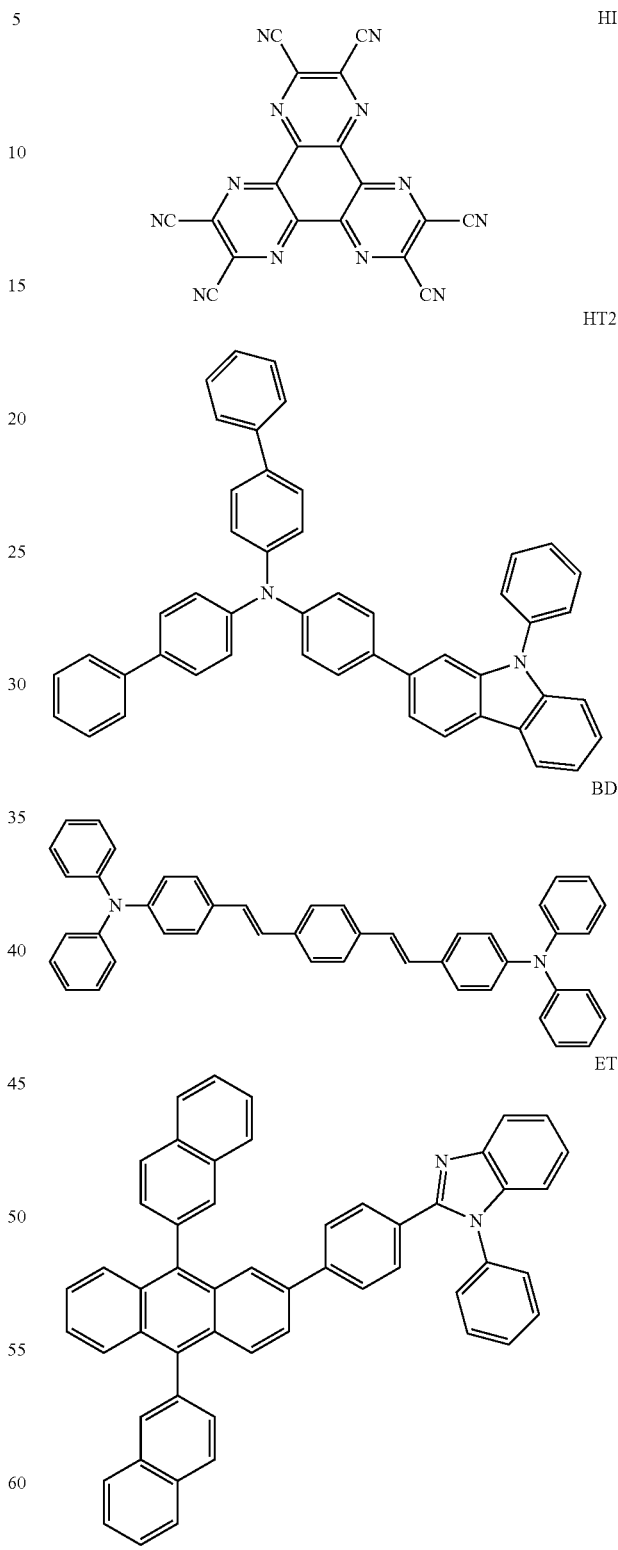

Figure 3:
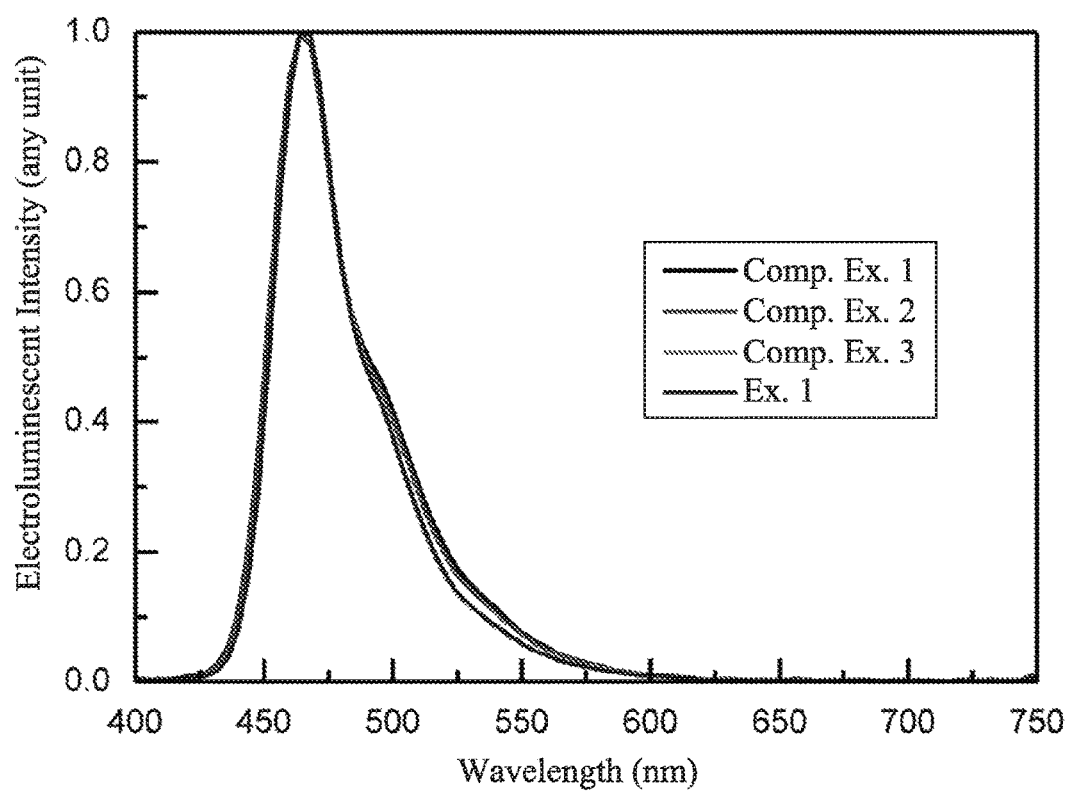
FIG. 3 is an electroluminescent spectrum of an organic fluorescent light-emitting element.

After aforementioned layers are deposited, the element is transported from the deposition chamber to a drying oven, and is packaged with a UV-curable epoxy resin and a glass cover plate containing moisture absorbent immediately. The organic light-emitting element has a light-emitting area of 3 mm². After being connected with an external power supply, the organic light-emitting element runs under direct current voltage, and the luminescent properties are shown in following Table 1. The electroluminescent spectrum of the organic light-emitting element is shown in FIG. 3, in which the organic light-emitting elements emit blue light.

Comparative Examples 1-3: Manufacture of Fluorescent Organic Light-Emitting Elements The organic light-emitting elements of Comparative Examples 1-3 are manufactured in the same way as Example 1, except that the compound used in the second hole assisting layer of Comparative Examples 1-3 is compound HC with the thickness of 1,700 Å, 1,800 Å and 1,900 Å, respectively.

The structures of the elements of Comparative Examples 1-3 can be represented as: ITO/HI/HC/HT2/BD:EPH/Liq: ET/LiF/Al.

HC

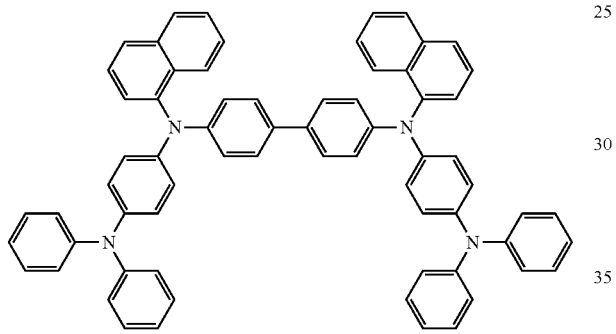

b) a first hole assisting layer with a thickness of 150 Å, HI;
c) a second hole assisting layer with a thickness of 950 Å, a compound of formula (Ia) doped with 3 weight % of HI;
d) a third hole assisting layer with a thickness of 150 Å, compound HT2;
e) a light-emitting layer with a thickness of 300 Å, comprising a host luminescent material EPH and a guest luminescent material compound PEG doped with 6 weight % of metal complex of iridium (PEG and EPH are trade names of products manufactured by e-Ray Optoelectronics Technology Co., Ltd.);
f) an electron transport layer with a thickness of 300 Å, comprising compound ET doped with 50 weight % of lithium quinolinolate (Liq);
g) an electron injection layer with a thickness of 10 Å, lithium fluoride (LiF); and
h) a cathode with a thickness of 1,500 Å, comprising Al.
The structure of the element can be represented as: ITO/HI/HI:(Ia)/HT2/PEG:EPH/Liq:ET/LiF/Al.

Examples 3 and 4: Manufacture of Phosphorescent Organic Light-Emitting Elements

The organic light-emitting element of Example 3 is manufactured in the same way of Example 2, except that the only compound used in the second hole assisting layer of Example 3 is the compound of formula (Ia).

The structure of the element of Example 3 can be represented as: ITO/HI/(Ia)/HT2/PEG:EPH/Liq:ET/LiF/Al.

The organic light-emitting element of Example 4 is manufactured in the same way of Example 2, except that the element of Example 4 has no third hole assisting layer, and the second hole assisting layer has a thickness of 1,100 Å.

The structure of the element of Example 4 can be represented as: ITO/HI/HI:(Ia)/PEG:EPH/Liq:ET/LiF/Al.

Comparative Example 4: Manufacture of Phosphorescent Organic Light-Emitting Elements The organic light-emitting element of Comparative Example 4 is manufactured in the same way of Example 2,

TABLE 1

|  | Drive voltage | Luminance L(cd/m²) | Current efficiency (cd/A) | Luminous efficiency (lm/w) | External quantum efficiency | T95 (hr) | T90 (hr) |
|---|---|---|---|---|---|---|---|
| Comp. Ex. 1 | 4.44 | 929.55 | 9.30 | 6.58 | 6.88 | 14 | 76 |
| Comp. Ex. 2 | 4.50 | 916.67 | 9.17 | 6.41 | 6.87 | 7.4 | 36.7 |
| Comp. Ex. 3 | 4.63 | 942.42 | 9.42 | 6.39 | 7.51 | 12.4 | 69.4 |
| Ex. 1 | 4.44 | 978.03 | 9.78 | 6.92 | 7.75 | 68 | 678 |

Example 2: Manufacture of Phosphorescent Organic Light-Emitting Elements

A substrate is cleaned to degrease using a solvent and ultraviolet together with ozone prior to loading the substrate to an evaporation system. Thereafter, the substrate is sent to a vacuum deposition chamber, and all layers are deposited on the top of the substrate. Each layer is deposited sequentially by a heated evaporation boat at a vacuum degree about $10^{-6}$ Torr:
a) an iridium tin oxide (ITO) layer with a thickness of 1,250 Å;

except that the element of Comparative Example 4 has no third hole assisting layer, and the material used in the second hole assisting layer is HT2 (with a thickness of 1,100 Å).

The structure of element of Comparative Example 4 can be represented as: ITO/HI/HT2/PEG:EPH/Liq:ET/LiF/Al.

Figure 4:
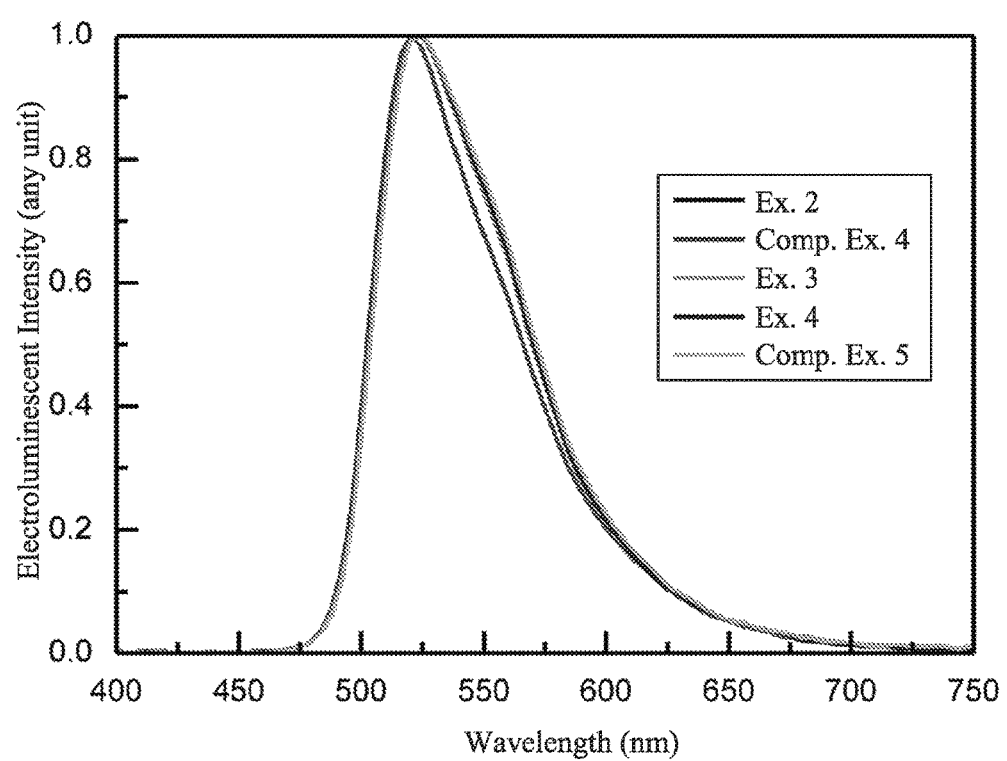
FIG. 4 is an electroluminescent spectrum of an organic phosphorescent light-emitting element.

The luminescent properties of the organic light-emitting elements run under direct current voltage are shown in following Table 2. The electroluminescent spectra of the organic light-emitting elements are shown in FIG. 4, in which the organic light-emitting elements emit green light.

TABLE 2

|  | Drive voltage | Luminance L(cd/m2) | Current efficiency (cd/A) | Luminous efficiency (lm/w) | External quantum efficiency | T95 (hr) | T90 (hr) |
| --- | --- | --- | --- | --- | --- | --- | --- |
| Ex. 2 | 3.32 | 6097.81 | 60.98 | 57.63 | 16.82 | 1724 | 5496 |
| Comp. Ex. 4 | 4.97 | 5695.62 | 56.96 | 35.97 | 15.86 | — | — |
| Ex. 3 | 3.30 | 6304.38 | 63.04 | 60.01 | 17.29 | 1103 | 3794 |
| Ex. 4 | 3.25 | 5372.99 | 53.73 | 51.86 | 14.71 | 1961 | 6038 |

Example 5: Manufacture of Phosphorescent Organic Light-Emitting Elements

A substrate is cleaned to degrease using a solvent and ultraviolet together with ozone prior to loading the substrate to an evaporation system. Thereafter, the substrate is sent to a vacuum deposition chamber, and all layers are deposited on the top of the substrate. Each layer is deposited sequentially by a heated evaporation boat at a vacuum degree about $10^{-6}$ Torr:

a) an iridium tin oxide (ITO) layer with a thickness of 1,100 Å;
b) a first hole assisting layer with a thickness of 150 Å, HI;
c) a second hole assisting layer with a thickness of 1,400 Å, a compound of formula (Ia) doped with 3 weight % of HI;
d) a third hole assisting layer with a thickness of 150 Å, compound HT2;
e) a light-emitting layer with a thickness of 300 Å, comprising a host luminescent material EPH and a guest luminescent material PER doped with 3 weight % of metal complex of iridium (PER and EPH are trade names of products manufactured by e-Ray Optoelectronics Technology Co., Ltd.);
f) an electron transport layer with a thickness of 300 Å, comprising compound ET doped with 50 weight % of lithium quinolinolate (Liq);
g) an electron injection layer with a thickness of 10 Å, lithium fluoride (LiF); and
h) a cathode with a thickness of 1,500 Å, comprising A1.

The structure of the element can be represented as: ITO/HI/HI:(Ia)/HT2/PER:EPH/Liq:ET/LiF/Al.

Examples 6 and 7: Manufacture of Phosphorescent Organic Light-Emitting Elements The organic light-emitting element of Example 6 is manufactured in the same way of Example 5, except that the only compound used in the second hole assisting layer of Example 6 is the compound of formula (Ia).

The structure of the element of Example 6 can be represented as: ITO/HI/(Ia)/HT2/PER:EPH/Liq:ET/LiF/Al.

The organic light-emitting element of Example 7 is manufactured in the same way of Example 5, except that the element of Example 7 has no third hole assisting layer, and the second hole assisting layer has a thickness of 1,550 Å.

The structure of the element of Example 7 can be represented as: ITO/HI/HI:(Ia)/PER:EPH/Liq:ET/LiF/Al.

Comparative Examples 5 and 6: Manufacture of Phosphorescent Organic Light-Emitting Elements The organic light-emitting elements of Comparative Examples 5 and 6 are manufactured in the same way of Example 5, except that the element of Comparative Example 5 has no third hole assisting layer, and the material used in the second hole assisting layer is HT2 (with a thickness of 1,550 Å); and Comparative Example 6 differs from Example 5 in that compound HC is used in the second hole assisting layer instead of the compound of formula (Ia).

The structure of the element of Comparative Example 5 can be represented as: ITO/HI/HT2/PER:EPH/Liq:ET/LiF/Al.

The structure of the element of Comparative Example 6 can be represented as: ITO/HI/HI:HC/HT2/PER:EPH/Liq:ET/LiF/Al.

Figure 5:
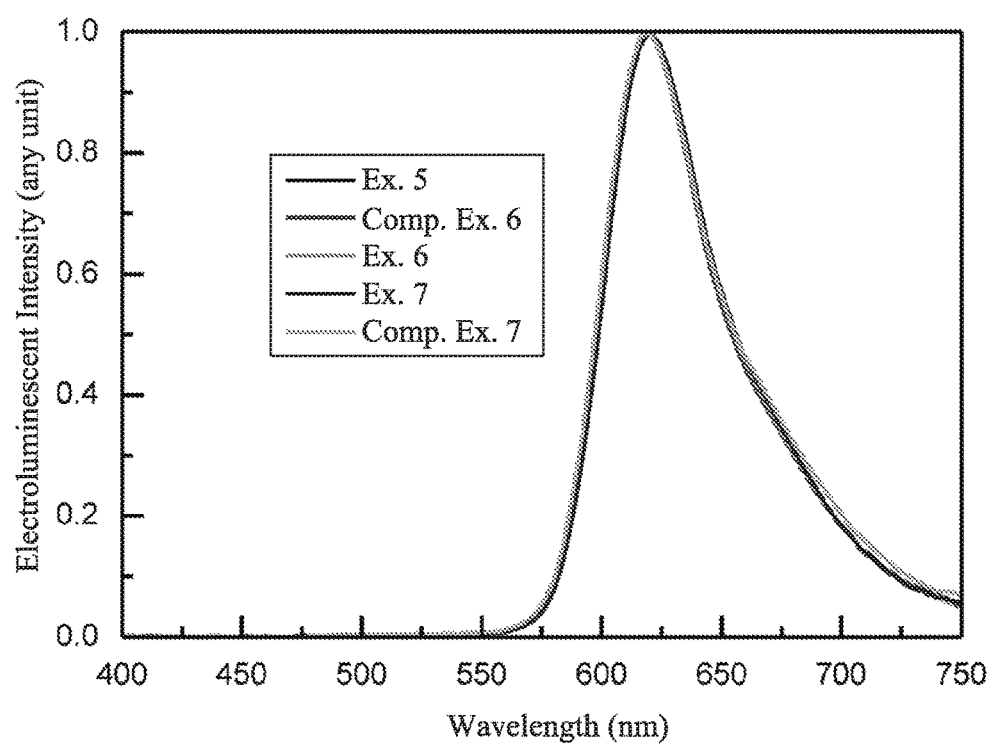
FIG. 5 is an electroluminescent spectrum of an organic phosphorescent light-emitting element.

Luminous properties of the organic light-emitting elements run under a direct current voltage are listed in the following Table 3. Electroluminescent spectra of the organic light-emitting elements are shown in FIG. 5, in which the organic light-emitting elements emit red light.

TABLE 3

|  | Drive voltage | Luminance L(cd/m2) | Current efficiency (cd/A) | Luminous efficiency (lm/w) | External quantum efficiency | T95 (hr) | T90 (hr) |
| --- | --- | --- | --- | --- | --- | --- | --- |
| Ex. 5 | 3.66 | 1969.29 | 19.69 | 16.90 | 17.10 | 546 | 2084 |
| Comp. Ex. 5 | 4.20 | 1915.71 | 19.16 | 14.31 | 16.19 | 456 | 1735 |
| Ex. 6 | 3.57 | 2033.57 | 20.34 | 17.91 | 17.60 | 282 | 1331 |
| Ex. 7 | 3.56 | 1820.71 | 18.21 | 16.07 | 15.89 | 468 | 1724 |
| Comp. Ex. 6 | 3.70 | 1815.71 | 18.16 | 15.42 | 15.65 | 476 | 1562 |

Examples afore mentioned are used for illustration of the mechanism and effects of the present disclosure rather than limiting the disclosure. Anyone skilled in the art can modified the above Examples without departing from the spirit and scope of the present disclosure. Hence, the range claimed by the present disclosure should be that listed in the following Claims.

The invention claimed is:
1. An organic light-emitting element, comprising:
an anode;
a first hole assisting layer and a second hole assisting layer sequentially formed on the anode, the second hole assisting layer containing a hole transport compound represented by formula (I),

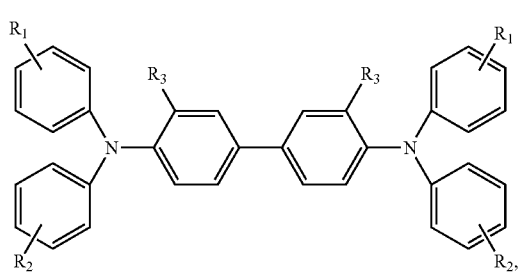

the first hole assisting layer containing a compound represented by formula (II),

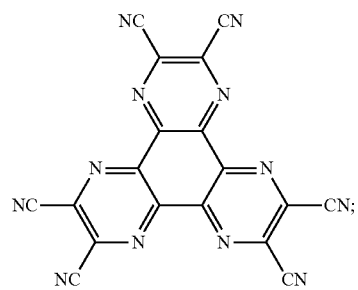

a third hole assisting layer formed on the second hole assisting layer and containing a compound represented by formula (IV),

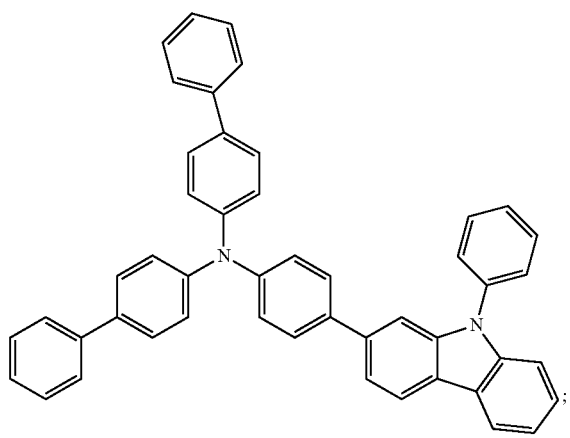

a light-emitting layer comprising a host luminescent material containing a compound having a carbazole group;
at least one electron transport layer formed on the light-emitting layer; and
a cathode formed on the electron transport layer,
wherein $R_1$ and $R_2$ independently represents hydrogen, unsubstituted phenyl, or phenyl substituted with C1-C4 alkyl, and $R_3$ represents hydrogen, C1-C4 alkyl, C1-C4 alkoxy or chlorine.

2. The organic light-emitting element of claim 1, wherein the light-emitting layer is formed on the third hole assisting layer.

3. The organic light-emitting element of claim 1, wherein $R_1$ and $R_2$ are the same.

4. The organic light-emitting element of claim 1, wherein $R_1$ and $R_2$ are different from each other.

5. The organic light-emitting element of claim 1, wherein the anode is made of indium tin oxide.

6. The organic light-emitting element of claim 1, wherein the cathode is made of aluminum.

7. The organic light-emitting element of claim 1, wherein $R_1$ and $R_2$ are unsubstituted phenyl, and $R_3$ is hydrogen.

8. The organic light-emitting element of claim 7, wherein the hole transport compound is represented by formula (Ia), (Ia)

9. The organic light-emitting element of claim 1, wherein the light-emitting layer contains a fluorescent material.

10. The organic light-emitting element of claim 9, wherein the fluorescent material is a guest luminescent material.

11. The organic light-emitting element of claim 10, wherein the guest luminescent material is a compound represented by formula (III), (III)

12. The organic light-emitting element of claim 9, wherein the light-emitting layer emits blue light.

13. The organic light-emitting element of claim 1, wherein the light-emitting layer contains a phosphorescent material.

14. The organic light-emitting element of claim 13, wherein the phosphorescent material is a guest luminescent material.

15. The organic light-emitting element of claim 14, wherein the guest luminescent material is a metal complex of iridium.

16. The organic light-emitting element of claim 13, wherein the light-emitting layer emits red or green light.

\* \* \* \* \*